US009886989B2

(12) United States Patent
Ducruet et al.

(10) Patent No.: US 9,886,989 B2
(45) Date of Patent: Feb. 6, 2018

(54) LOW POWER MAGNETIC RANDOM ACCESS MEMORY CELL

(75) Inventors: Clarisse Ducruet, Grenoble (FR); Céline Portemont, Semons (FR); Ioan Lucian Prejbeanu, Seyssinet Pariset (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 1632 days.

(21) Appl. No.: 13/352,706

(22) Filed: Jan. 18, 2012

(65) Prior Publication Data

US 2012/0181644 A1 Jul. 19, 2012

(30) Foreign Application Priority Data

Jan. 19, 2011 (EP) ..................... 11290031

(51) Int. Cl.
*H01L 29/82* (2006.01)
*G11C 11/16* (2006.01)

(52) U.S. Cl.
CPC ........ *G11C 11/161* (2013.01); *G11C 11/1675* (2013.01)

(58) Field of Classification Search
USPC ....................................................... 257/421
See application file for complete search history.

(56) References Cited

U.S. PATENT DOCUMENTS 5,583,725 A 12/1996 Coffey et al.
5,640,343 A 6/1997 Gallagher et al.
6,950,335 B2 9/2005 Dieny et al.
2007/0297223 A1* 12/2007 Chen ................. G11C 11/16
365/173
2012/0181642 A1* 7/2012 Prejbeanu ............. B82Y 25/00
257/421

FOREIGN PATENT DOCUMENTS

EP 2249350 A1 11/2010
WO 2010026667 A1 3/2010

OTHER PUBLICATIONS

European Search Report for EP11290031 dated Aug. 18, 2011.

* cited by examiner

*Primary Examiner* — Jack Chen
(74) *Attorney, Agent, or Firm* — Pearne & Gordon LLP

(57) ABSTRACT

The present disclosure concerns a magnetic random access memory (MRAM) cell suitable for performing a thermally assisted write operation or a spin torque transfer (STT) based write operation, comprising a magnetic tunnel junction comprising a top electrode; a tunnel barrier layer comprised between a first ferromagnetic layer having a first magnetization direction, and a second ferromagnetic layer having a second magnetization direction adjustable with respect to the first magnetization direction; a front-end layer; and a magnetic or metallic layer on which the second ferromagnetic layer is deposited; the second ferromagnetic layer being comprised between the front-end layer and the tunnel barrier layer and having a thickness comprised between about 0.5 nm and about 2 nm, such that magnetic tunnel junction has a magnetoresistance larger than about 100%. The MRAM cell disclosed herein has lower power consumption compared to conventional MRAM cells.

15 Claims, 4 Drawing Sheets

LOW POWER MAGNETIC RANDOM ACCESS MEMORY CELL

FIELD OF THE INVENTION

The present invention concerns a magnetic random access memory (MRAM) cell suitable for performing a thermally assisted write operation or a spin torque transfer (STT) based write operation, and that can be written with a small field or spin polarized write current while having a high magnetoresistance.

DESCRIPTION OF RELATED ART

Magnetic tunnel junction (MTJ) based magnetic random access memory (MRAM) cells have been the object of a renewed interest with the discovery of magnetic tunnel junctions having a strong magnetoresistance at ambient temperature. Indeed, these MRAM cells have many advantages such as speed (a write and a read operation can has duration of a few nanoseconds), non volatility, and insensitivity to ionizing radiations. Consequently, they are increasingly replacing memories using more conventional technology, for example, based on the charge state of a capacitor, such as DRAM, SRAM and FLASH.

In their simplest implementation, MRAM cells can be formed of a magnetic tunnel junction comprising two ferromagnetic layers separated by a thin insulating layer. One of the two ferromagnetic layers is typically a so-called reference layer and is characterized by having a fixed magnetization. The other ferromagnetic layer is typically a so-called a storage layer and is characterized by a magnetization direction that can be varied during a write operation of the MRAM cell.

During a write operation of the MRAM cell, the magnetization direction of the storage layer can be aligned such as to become parallel or antiparallel with respect to the magnetization direction of the reference layer such as to vary a tunnel junction resistance of the MRAM cell. When the magnetization direction of the storage layer is oriented parallel with the one of the reference layer, the tunnel junction resistance is small, while the tunnel junction resistance is large in the case the magnetization direction of the storage layer is oriented antiparallel with the one of the reference layer.

U.S. Pat. No. 5,640,343 discloses such a MRAM cell where the magnetic tunnel junction is electrically connected at one end to a first current line and a second current line is disposed orthogonal to the first current line. A write operation of the MRAM cell comprises passing a first field current in the first current line generating a first magnetic field, and passing a second field current in the second current line generating a second magnetic field. The first and second magnetic fields are such as to switch the magnetization direction of the storage layer. In an array comprising a plurality of the MRAM cell, only the cell being located at the intersection of the first and second current line is being written under combined first and second magnetic fields. Other write operation methods of the MRAM cell include so-called magnetic field switching, Stoner-Wohlfarth switching, toggle Switching, and precessional switching.

The reference and the storage layers are typically made of 3d metals such as Fe, Co or Ni or their alloys. Boron can be added in the layer composition in order obtain an amorphous morphology and a flat interface. The insulating layer typically consists of alumina ($Al_2O_3$) or magnesium oxide (MgO). The reference layer can be formed from a synthetic antiferromagnetic layer such as described in U.S. Pat. No. 5,583,725.

The magnetic tunnel junction usually has an anisotropic form with high aspect ratio, of typically 1.5 or more, in order to achieve a bistable functioning of the MRAM cell, a good writing selectivity between the selected MRAM cell and the half-selected cells located on the same line and/or column, and a good thermal and/or temporal stability of the information written in the MRAM cell.

U.S. Pat. No. 6,950,335 discloses a thermally assisted switching (TAS) based MRAM cell such as the one represented in FIG. 1, and a write operation of the TAS based MRAM cell. The TAS-MRAM cell 1 comprises a magnetic tunnel junction 2 formed of, from top to bottom, a second ferromagnetic, or storage layer 23, a tunnel barrier layer 22, and a first ferromagnetic layer, reference layer 21. An antiferromagnetic storage layer 24 is disposed on top of the storage layer 23 and pins its magnetization at a low temperature threshold and frees it at a high temperature threshold. The magnetic tunnel junction 2 further comprises an antiferromagnetic reference layer 25, disposed below the reference layer 21 and pinning its magnetization. The TAS-MRAM cell 1 also comprises a current line 4 connected to the magnetic tunnel junction 2 on the side of the reference layer 21, and a front-end layer comprising one or more layers of a dielectric such as silicon oxide or low-k dielectric materials, possibly comprising other conductive layers or other semiconductor elements, such as transistors. In FIG. 1, the front-end layer is represented by a CMOS selection transistor 3 connected to the magnetic tunnel junction 2 on the side of the storage layer 23.

Also disclosed in U.S. Pat. No. 6,950,335 is a TAS, spin torque transfer (STT) write operation comprising passing a spin polarized write current 31 through the magnetic tunnel junction 2, when the selection transistor is in a saturated mode. The spin polarized write current 31 induces a local spin torque on the storage layer 23, switching its magnetization. The TAS-STT write operation can further comprise a step of heating the magnetic tunnel junction 2 simultaneously (or after a short time delay) with switching the magnetization direction of the storage layer 23. Heating the magnetic tunnel junction 2 can be performed by passing the spin polarized write current 31 with a magnitude that is high enough for heating the magnetic tunnel junction 2 at the high temperature threshold.

The size of the TAS-MRAM cell 1 written with the TAS-STT write operation can be reduced compared to conventional MRAM cells as no field line is required. Other advantages of the TAS-MRAM cell 1 comprise fast write operation and low power consumption due to the lower magnitude of the spin polarized write current required for switching the storage layer magnetization in comparison with conventional MRAM cells. The TAS-MRAM cell 1 in combination with the TAS-STT write operation is thus considered as the most promising route for high density MRAM based devices.

The spin polarized write current scales inversely proportional with the area of the magnetic tunnel junction, or with the volume of the storage layer. The magnitude of the spin polarized write current required for switching the magnetization direction of the storage layer can thus be reduced by decreasing the size of the storage layer. However, reducing the thickness (and thus the volume) of the storage layer results in a decrease in the magnetoresistance of the magnetic tunnel junction.

In conventional MRAM cells such as the one shown in FIG. 1, the magnetic tunnel junction comprises the storage layer disposed between the tunnel barrier layer and the top electrode. During the fabrication of the magnetic tunnel junction, the storage layer is then grown on the tunnel barrier layer. In FIG. 2, the magnetoresistance (TMR) of the magnetic tunnel junction of a MRAM cell is plotted against the thickness of the storage layer. The magnetoresistance was measured for the storage layer made of a Co70Fe30 alloy (closed stars) and a Co60Fe20B20 alloy (open stars). As can be seen in FIG. 2, the magnetoresistance has a value of about 150% for the storage layer having a thickness comprised between about 2 and 3.5 nm, and decreases rapidly when the thickness of the storage layer is decreased below 2 nm. The magnetoresistance falls to 0% for a storage layer thickness of about 1.5 nm for the storage layer made of the Co70Fe30 alloy, and 1.2 nm for the storage layer made of the Co60Fe20B20 alloy. Diminishing the thickness of the storage layer for decreasing the magnitude of the spin polarized write current is then at the expense of the magnetoresistance and thus, on the read margin of the MRAM cell.

BRIEF SUMMARY OF THE INVENTION

The present disclosure is therefore aimed at overcoming these disadvantages.

The present disclosure concerns a magnetic random access memory (MRAM) cell suitable for performing a thermally assisted write operation or a spin torque transfer based write operation, that can comprise a magnetic tunnel junction comprising a top electrode; a first ferromagnetic layer having a first magnetization direction; a second ferromagnetic layer having a second magnetization direction that can be adjusted with respect to the first magnetization direction; a tunnel barrier layer between the first ferromagnetic layer and the second ferromagnetic layer; a and a front-end layer, the second ferromagnetic layer being between the front-end layer and the tunnel barrier layer; a magnetic or metallic layer on which the second ferromagnetic layer is deposited; the second ferromagnetic layer having a thickness comprised between about 0.5 nm and about 2 nm and the magnetic tunnel junction having a magnetoresistance larger than about 100%.

In yet another embodiment, the second magnetization direction of the second ferromagnetic layer can be adjusted in a reversible way by passing a spin polarized current in the magnetic tunnel junction.

In yet another embodiment, the second ferromagnetic magnetic layer can be made from an alloy comprising one of Fe, Ni, Co, Cr, V, Si and B, or a combination of any one of them.

In yet another embodiment, the magnetic tunnel junction can further comprise an underlayer in contact with the second ferromagnetic layer.

In yet another embodiment, the underlayer can be made of a metallic polycrystalline alloy comprising one of Ta, Ti, Cu, Ru, NiFe, TiW, NiFeCr, CoSi, or comprising one of TaN, TiN, CuN, TiWN, CoSiN.

In yet another embodiment, the underlayer can have a thickness in the range comprised between about 1 nm and about 100 nm.

In yet another embodiment, the magnetic or metallic layer comprises an antiferromagnetic storage layer.

In yet another embodiment, said magnetic or metallic layer comprises a bottom electrode.

The present disclosure also pertains to a method for forming the MRAM cell, comprising:

depositing the second ferromagnetic layer on a magnetic or metallic layer;
depositing the tunneling barrier layer on the second ferromagnetic layer; and
depositing the first ferromagnetic layer on the tunneling barrier layer; wherein
the second ferromagnetic layer can be deposited with a thickness comprised between about 0.5 nm and about 2 nm.

In an embodiment, the magnetic tunnel junction can further comprise a bottom electrode, and the method can further include depositing the bottom electrode, and depositing the second ferromagnetic layer on the bottom electrode.

In another embodiment, the magnetic tunnel junction can further comprise an antiferromagnetic storage layer, and the method can further comprise depositing the antiferromagnetic storage layer between the bottom electrode and the second ferromagnetic layer.

In yet another embodiment, the method can further comprise depositing an underlayer made of a metallic polycrystalline alloy, said depositing the second ferromagnetic layer comprising depositing the second ferromagnetic layer on the underlayer.

In yet another embodiment, the underlayer can be deposited with a thickness being comprises between about 1 nm and about 100 nm.

In yet another embodiment, the second ferromagnetic layer can be deposited such that the crystallographic structure of the underlayer matches the one of the second ferromagnetic layer.

In yet another embodiment, said second ferromagnetic layer can be deposited with a roughness less than about 0.2 nm rms and grain size smaller than about 15 nm.

The MRAM cell disclosed herein allows decreasing the magnitude of the spin polarized write current required to switch the magnetization direction of the storage layer by a factor of at least two compared to the one required in conventional MRAM cells, while having a magnetoresistance being about 100% or greater.

The method for forming the MRAM cell disclosed herein allows for a better control of the morphology and crystallographic structure of the deposited storage layer. For example, a small grained structure of the storage layer can be obtained such that the magnetic field required for switching the magnetization of the storage layer can be reduced compared to the storage layer of a conventional magnetic tunnel junction. Other advantages of the disclosed MRAM cell and method can be found in the detailed description below.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 3:
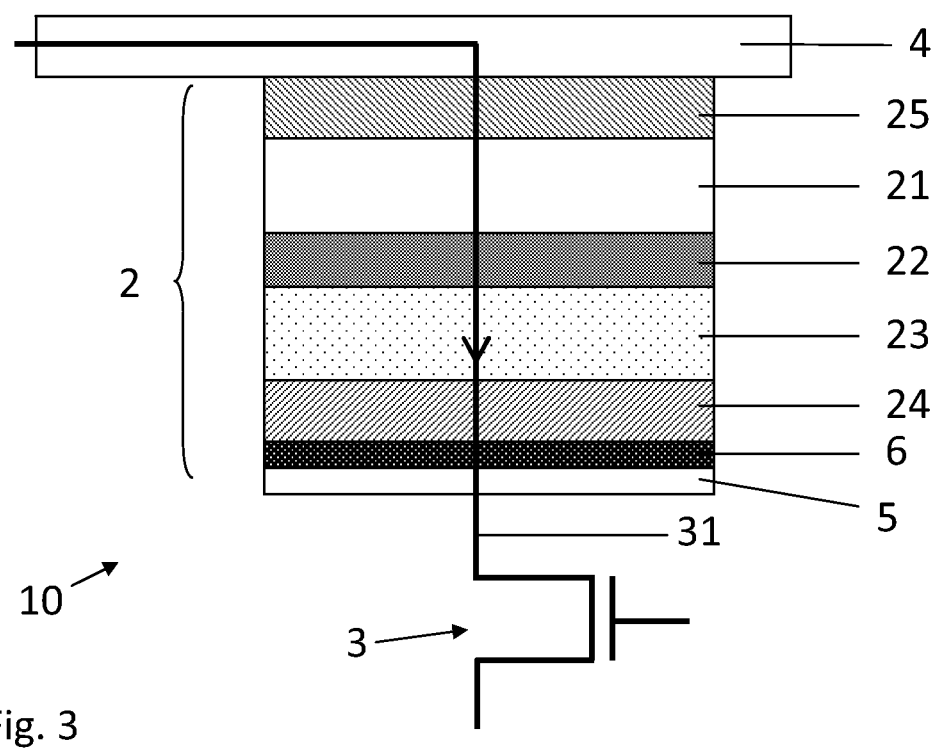
FIG. 3 represents a MRAM cell comprising a magnetic tunnel junction with a second ferromagnetic layer, according to an embodiment.
Figure 2:
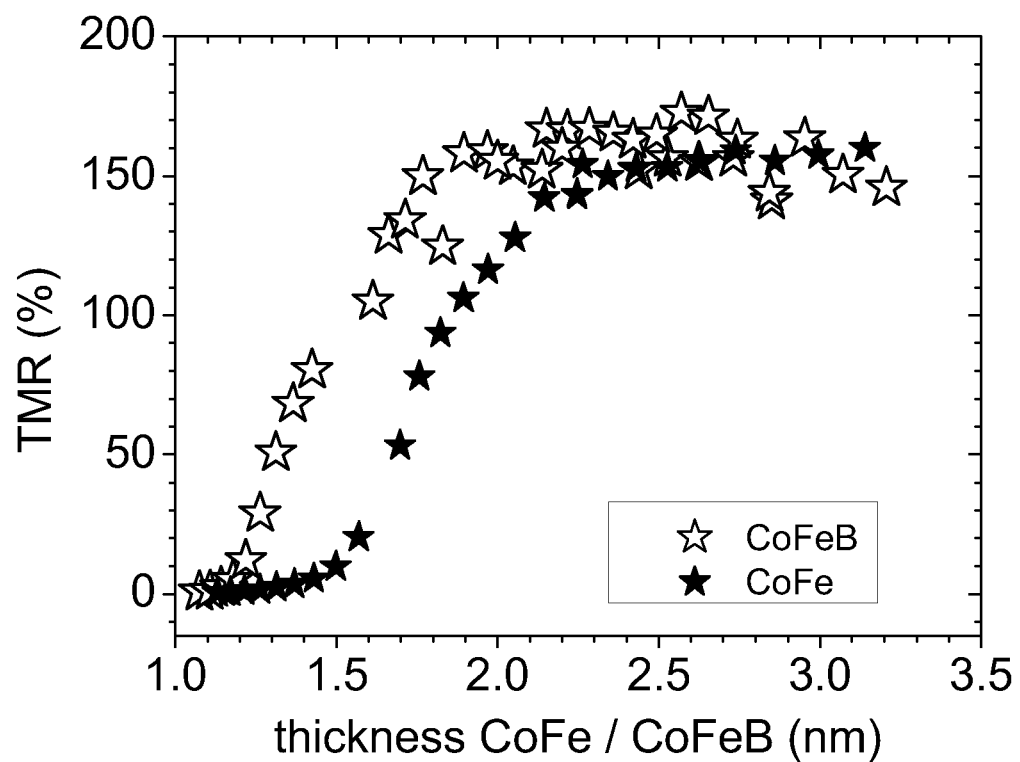
FIG. 2 shows the magnetoresistance measured in the conventional MRAM cell plotted against the thickness of the storage layer.

FIG. 3 represents a magnetic random access memory (MRAM) cell 10. The MRAM cell 10 comprises a magnetic tunnel junction 2 comprising, from top to bottom, a first ferromagnetic layer 21 having a first magnetization magnetization direction, a tunnel barrier layer 22, and a second ferromagnetic layer 23 having a second magnetization direction that can be adjusted with respect to the first magnetization direction. A top electrode, or current line 4, is electrically connected to the magnetic tunnel junction 2 on the side of the first ferromagnetic layer 21. A front-end layer comprising, represented by a CMOS selection transistor 3 in FIG. 3 is electrically connected to the magnetic tunnel junction 2, possibly via a bottom electrode 5, on the side of the second ferromagnetic layer 23. The front-end layer can comprise one or more layers of a dielectric such as silicon oxide or low-k dielectric materials disposed over silicon single-crystal silicon, for example. The front-end layer may include other conductive layers or other semiconductor elements, such the selection transistor 3 or any other switching devices.

Figure 1:
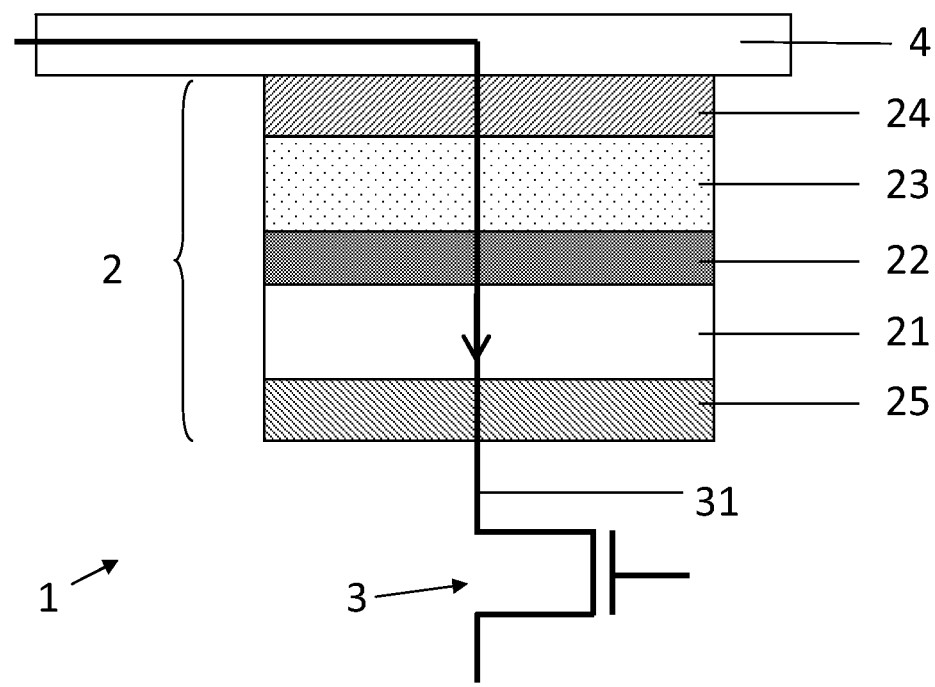
FIG. 1 is a schematic representation of a conventional a magnetic random access memory (MRAM) cell comprising magnetic tunnel junction with a storage layer.

In the configuration of the magnetic tunnel junction 2 of FIG. 3, the position of the second ferromagnetic layer 23 and the first ferromagnetic layer 21 with respect to the tunnel barrier layer 22, the current line 4 and the bottom electrode 5 is reversed compared to the configuration of the conventional TAS-MRAM cell 1 of FIG. 1. In particular, the second ferromagnetic layer 23 is located between the front-end layer 3 and the tunnel barrier layer 22.

According to an embodiment, the second ferromagnetic layer 23 is made from a ferromagnetic material comprising an alloy based on one of Fe, Ni, Co, Cr, V, or a combination of any one of them. The alloy can further comprise Si and/or boron (B). Preferably, the second ferromagnetic layer 23 is made form a $CoFeB_xSi_y$ alloy where x is comprised between 0% and 25% by atomic weight and y is comprised between 0% and 10% by atomic weight. The first ferromagnetic layer 21 is made from a Fe, Co or Ni based alloy, where the Co and/or Fe alloy can further contain B. The tunnel barrier layer 22 can be an insulating layer, for example, made from an oxide selected in the group including among others aluminum oxides $Al_2O_3$ and magnesium oxides MgO. Alternatively, the tunnel barrier layer 22 can be of semi-conducting nature (for example on the basis of silicon or germanium or of GaAs) or a heterogeneous metal/oxide layer, such as layers having a confined current path developed in the context of magnetoresistive reader heads for hard drives. These are for example constituted of $Al_{1-x}Cu_x$ alloys with x being comprised between 0.5 and 10% by atomic weight, which are oxidized, forming an amorphous alumina layer bored with metal copper holes.

According to an embodiment, the second ferromagnetic layer, or storage layer 23, has its magnetization direction being adjustable in a reversible manner. A write operation based on a spin torque transfer (STT) scheme comprises a step of passing a spin polarized write current 31 in the current line 4 to the magnetic tunnel junction 2 when the selection transistor 3 is set in a saturated mode. The spin polarized write current 31 is passed with a first intensity suitable for adjusting reversibly the magnetization of the storage layer 23 in accordance with the local spin torque induced by the spin polarized write current 31. The magnetization of the storage layer 23 is adjusted relative to the fixed first magnetization of the first ferromagnetic layer, or reference layer 21.

In a variant, the write operation further comprises a step of heating the magnetic tunnel junction 2. This can be accomplished by passing the spin polarized write current 31 with a second intensity higher that the first intensity, such that the magnetic tunnel junction 2 is heated at a high temperature threshold at which the magnetization of the storage layer 23 can be freely adjusted. The magnitude of the spin polarized write current 31 is then decreased to the first intensity, such that the magnetization of the storage layer 23 remains aligned by the spin polarized write current 31 and the temperature of the magnetic tunnel junction 2 reaches a low temperature threshold where the storage layer magnetization fixed in the written state. The spin polarized write current 31 can then be turned off by setting the selection transistor 3 in a blocked mode.

In another embodiment, the write operation is based on a external magnetic field and comprises passing a field current (not shown) in the current line 4 with an intensity and polarity such as to generate a magnetic field adapted to align the magnetization direction of the storage layer 23. This is performed with the selection transistor 3 being in the blocked mode such that the field current does not pass through the magnetic tunnel junction 2. The magnetic field based write operation can also comprise a step of heating the magnetic tunnel junctions 2. For example, a heating current (not shown) can be passed through the magnetic tunnel junctions 2 via the first bit line 4 when the selection transistor 3 is in the saturated mode. The magnetization of the storage layer 23 is aligned in the external magnetic field once the magnetic tunnel junction has reached a predetermined high threshold temperature. Such a Thermally-assisted switching write operation is described in more details in U.S. Pat. No. 6,950,335.

According to an embodiment, the magnetic tunnel junction 2 further comprises an antiferromagnetic storage layer 24 that is disposed between the bottom electrode 5 and the storage layer 23. The antiferromagnetic storage layer 24 exchange-couples the storage layer 23 such as to pin, or fixing, its magnetization direction at the low temperature threshold. At the high temperature threshold the magnetization of the storage layer 23 is no longer pinned by antiferromagnetic storage layer 24 and can be freely adjusted under the spin polarized write current 31. The antiferromagnetic storage layer can be made of a manganese-based alloy, such as IrMn or FeMn, or any other suitable materials. The high temperature threshold is typically at or above a temperature of about 120° C. The magnetic tunnel junction 2 can further comprise an antiferromagnetic reference layer 25, preferably disposed between the reference layer 21 and the current line 4, and pinning the magnetization of the reference layer 21 at the high temperature threshold. The antiferromagnetic reference layer 25 is preferably formed of a manganese (Mn) based alloy, for example, comprising one of PtMn, NiMn, IrMn, and FeMn.

According to another embodiment not represented, the reference layer 21 comprises a three-layer synthetic antiferromagnetic pinned layer typically comprising a first ferromagnetic reference layer and a second ferromagnetic reference layer, both formed of a Fe, Co or Ni based alloy, and antiferromagnetically coupled by inserting between them a non-ferromagnetic reference layer made, for example, of ruthenium. Alternatively, the storage layer 23 can also be formed from synthetic ferrimagnet free layer and the three-layer synthetic antiferromagnetic structure.

In yet another embodiment, The MRAM cell 10 is used as a self-referenced cell such as the one described in pending European application No. 10168729 by the present applicant. In this configuration, the first ferromagnetic layer 21 is used as a storage layer such that, during the write operation, its magnetization direction can be switched from an initial stable direction to a switched stable direction, for example, by the external magnetic field. The second ferromagnetic layer 23 is used as a sense layer such that, during a read operation, its magnetization direction can be freely aligned, for example, by the external magnetic field.

In the case the MRAM cell 10 is used as a self-referenced cell, the thin second ferromagnetic layer 23 used as a sense layer requires a lower switching field to align its magnetization, and a magnetic field induced by the aligned magnetization of the second ferromagnetic layer 23 is less likely to influence the magnetization of the first ferromagnetic layer 21 (here used as a storage layer), compared to a conventional self-referenced MRAM cell.

According to an embodiment, a method of forming the magnetic tunnel junction 2 of the MRAM cell 1 includes depositing the antiferromagnetic storage layer 24 and depositing the second ferromagnetic layer 23 on the antiferromagnetic storage layer 24. The method further includes depositing the tunnel barrier layer 22 on the second ferromagnetic layer 23, and depositing the first ferromagnetic layer 21 on the tunnel barrier layer 22. Moreover, the method includes depositing the antiferromagnetic reference layer 25 on the first ferromagnetic layer 21 and the top electrode layer 4 on top of the antiferromagnetic reference layer 25.

In an embodiment, the method further includes a step of depositing the bottom electrode 5 and depositing the second ferromagnetic layer 23 on the bottom electrode 5. This can be performed, for example, in the case the magnetic tunnel junction 2 does not comprise the antiferromagnetic layer 24, or the antiferromagnetic layer 24 is disposed in the magnetic tunnel junction in another location than below the second ferromagnetic layer 23.

Alternatively, the second ferromagnetic layer 23 may be deposited on any other magnetic or metallic layer (not represented) provided that the second ferromagnetic layer 23 is between the magnetic or metallic layer and the tunnel barrier layer 22. Indeed, in order to preserve the magnetic properties of the magnetic tunnel junction such as a large tunnel magnetoresistance, the magnetic or metallic layer must not be interposed between the second ferromagnetic layer 23 and the tunnel barrier layer 22. In an embodiment, depositing the second ferromagnetic layer 23 comprises depositing a ferromagnetic layer containing Co atoms, Fe atoms, and possibly B atoms, using a sputtering deposition method. The method of depositing is not limited to sputtering and may also be any physical vapor deposition (PVD) such as, MBE (molecular beam epitaxy), PLD (pulsed laser deposition), or the like. Since the second ferromagnetic layer 23 is located between the front-end layer 3 and the tunnel barrier layer 22, the second ferromagnetic layer 23 can be deposited on a magnetic or metallic layer such as the antiferromagnetic layer 24 and the bottom electrode 5. The deposited second ferromagnetic layer 23 can then have a smaller thickness in comparison to when it is deposited on the tunnel barrier layer 22 as in conventional magnetic tunnel junctions.

According to an embodiment, the second ferromagnetic layer 23 is deposited with a thickness comprised in the range comprised between about 0.5 nm to about 2 nm, or of about 1 to about 10 atomic monolayers.

According to another embodiment, the method of forming an MRAM cell further includes depositing an underlayer 6. The underlayer 6 can be made of a metallic polycrystalline alloy comprising one of Ta, Ti, Cu, Ru, NiFe, TiW, NiFeCr, and CoSi. Alternatively, the underlayer 6 can be formed from a nitride, such as one of TaN, TiN, CuN, TiWN, CoSiN. The underlayer 6 formed from the nitride can achieve an amorphous or semi-amorphous morphology. The underlayer 6 can be deposited with a thickness being preferably in the range comprises between about 1 nm and about 100 nm. The second ferromagnetic layer 23 is then deposited on the underlayer 6.

A better control of the growth of the second ferromagnetic layer 23 can be achieved when the latter is deposited on the underlayer 6. More particularly, the second ferromagnetic layer 23 having a roughness of less than about 0.2 nm rms and grain size of less than about 15 nm can be deposited on the underlayer 6 having a crystallographic structure that matches the one of the second ferromagnetic layer 23. The deposition method allows for control on the distribution of the grain size in the second ferromagnetic layer 23. The small grained structure of the second ferromagnetic layer 23 allows a reduced magnetic field to be used for switching the magnetization of the second ferromagnetic layer 23 compared to the storage layer of a conventional magnetic tunnel junction.

Figure 4:
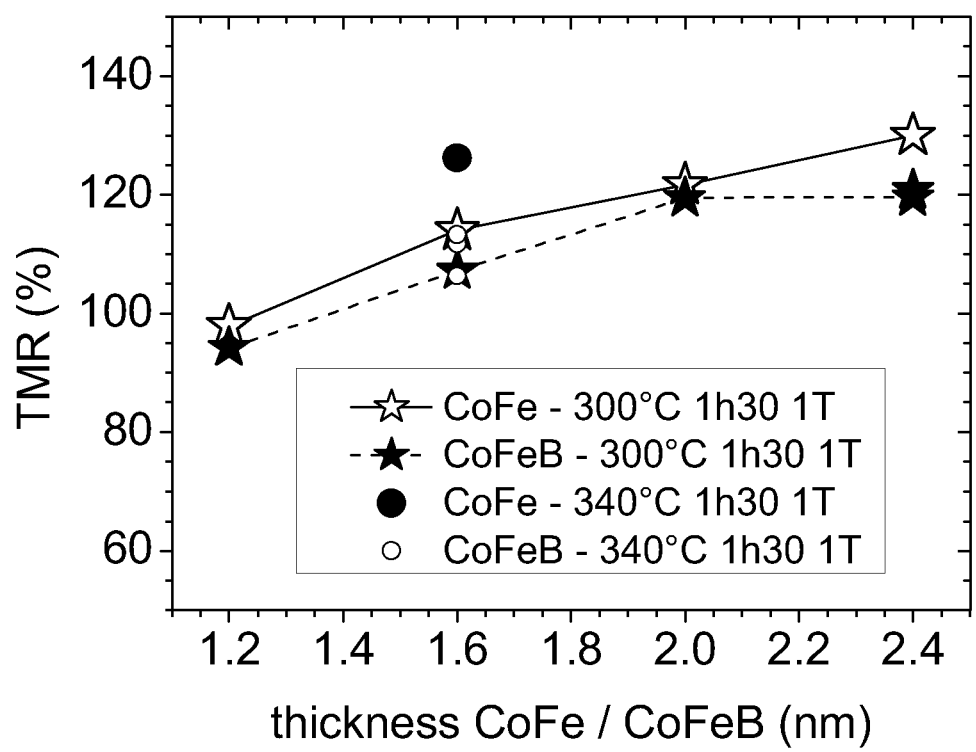
FIG. 4 illustrates the magnetoresistance measured in the MRAM cell of FIG. 3 against the thickness of the second ferromagnetic layer.

In FIG. 4, the magnetoresistance (TMR) measured for the magnetic tunnel junction 2 is plotted against the thickness of the deposited second ferromagnetic layer 23. The measured magnetoresistance values are represented for the second ferromagnetic layer 23 made of a Co70Fe30 alloy annealed at 300° C. (open star) and at 340° C. (closed star). The magnetoresistance values for the second ferromagnetic layer 23 made of a Co60Fe20B20 alloy are also represented when annealed at 300° C. (closed circle) and at 340° C. (open circle). The annealing was performed during 1 h30 under an applied magnetic field of about 1 Tesla in all cases. A magnetoresistance value comprised between about 100% and 120 is measured for the second ferromagnetic layer 23 having a thickness varying between about 1.2 and 2.4 nm. More particularly, the graph of FIG. 3 shows that magnetoresistance values of about 100% can be obtained for the second ferromagnetic layer 23 of about 1.2 nm in thickness.

Figure 5:
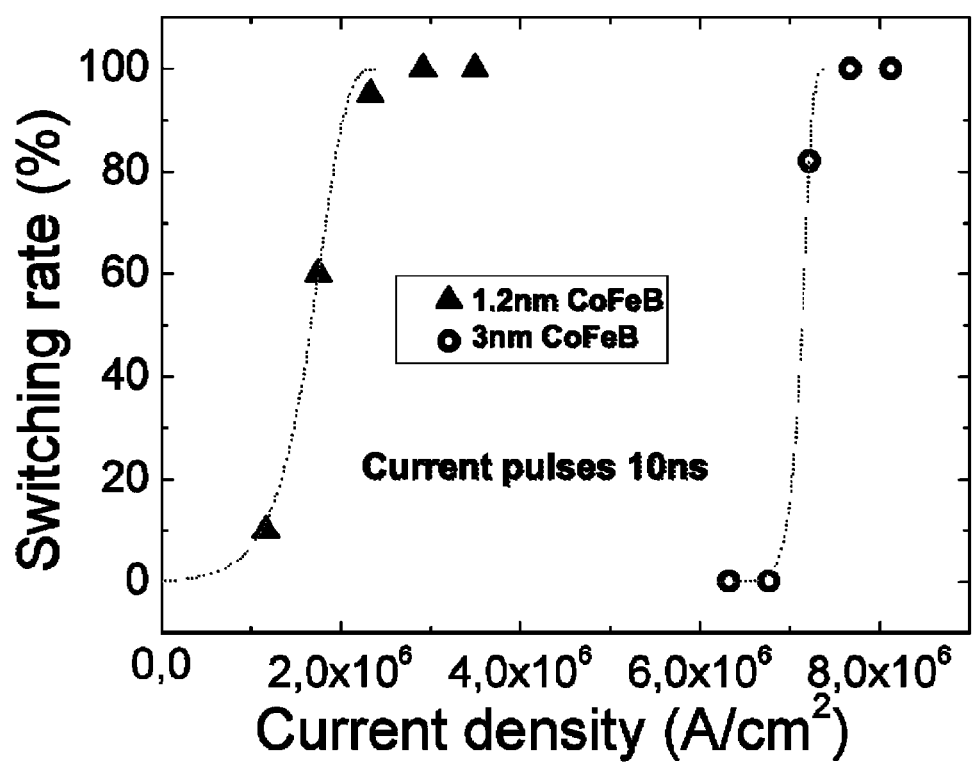
FIG. 5 illustrates the switching rate of the MRAM cell of FIG. 3 against the intensity of the spin polarized write current density passing in the magnetic tunnel junction.

Further measurements not represented have shown that a magnetoresistance value larger than about 100% can be obtained for the second ferromagnetic layer 23 made of the Co70Fe30 alloy or the Co60Fe20B20 alloy and having a thickness comprised between about 0.5 nm and about 2 nm, where the second ferromagnetic layer 23 was annealed at a temperature comprised between about 280° C. and about 360° C., during an annealing time period comprised between about 30 min and 2 h30, under the applied magnetic field comprised between about 0.5 Tesla and about 2 Tesla. In FIG. 5, the switching rate of the MRAM cell 1 is plotted as a function of the intensity of the spin polarized write current density 31 for the magnetic tunnel junction 1 comprising the second ferromagnetic, or storage layer 23 of about 3 nm in thickness (open circles) and the storage layer 23 of about 1.2 nm in thickness (closed triangles). In the figure, the spin polarized write current density 31 is passed in the magnetic tunnel junction 2 as a current pulse of about 10 ns in duration. FIG. 5 shows that the magnetization of the storage layer 23 having a thickness of 1.2 nm can be completely switched (switching rate of 100%) by passing a spin polarized write current 31 with the first intensity of about $2 \times 10^6$ A/cm² in the magnetic tunnel junction 2. In the case of the storage layer 23 having a thickness of 3 nm, the first intensity of the spin polarized write current 31 must be above $6 \times 10^6$ A/cm² in order to perform the complete switching (100%).

The magnetic tunnel junction 2 disclosed herein thus allows for achieving magnetoresistance values comprised between about 100% and 120% when the second ferromagnetic layer 23 has a thickness that is comprised between about 1 nm and 2.4 nm. More particularly, a magnetoresistance value of about 100% and higher can be achieved when the second ferromagnetic layer 23 has a thickness that is comprised between about 0.5 nm and 2 nm.

The magnetization of the second ferromagnetic layer 23 can be switched by passing the spin polarized write current 31 with the first intensity above about $6 \times 10^6$ A/cm² for the second ferromagnetic layer 23 having a thickness of about 3 nm, and with a magnitude above about $2 \times 10^6$ A/cm², when the second ferromagnetic layer 23 a thickness of about 1.2 nm. Consequently, the magnitude of the spin polarized write current 31 needed to switch the magnetization direction of the second ferromagnetic layer 23 can be lower by a factor of at least two compared to the one required in conventional MRAM cells, where the second ferromagnetic layer 23 has a thickness typically above 3 nm. Moreover, in the case the TAS-MRAM cell 1 is written using the TAS write operation, the high magnetoresistance can be combined with a low switching magnetization of the second ferromagnetic layer 23. The low switching magnetization allows for minimizing further the magnitude of the spin polarized write current 31 necessary for switching the magnetization direction of the second ferromagnetic layer 23.

Similarly, when written with the external magnetic field, the MRAM cell 10 disclosed herein has lower power consumption compared to conventional MRAM cells. Indeed, the thin second ferromagnetic layer 23 allows for using a lower external magnetic field and thus, a lower field current than the one used in conventional MRAM cells. For the second ferromagnetic layer 23 having thicknesses higher than typically 2 nm, the external magnetic field is more likely to generate vortex states in the second magnetization. The second magnetization thus becomes more spatially inhomogeneous, requiring a higher field current for switching.

A magnetic memory device (not represented) can be formed from an array comprising a plurality of the MRAM cell 1 comprising the magnetic tunnel junction 2 disclosed herein.

REFERENCE NUMBERS AND SYMBOLS

1 MRAM cell
2 magnetic tunnel junction
21 first ferromagnetic layer, reference layer
22 tunnel barrier layer
23 second ferromagnetic layer, storage layer
24 antiferromagnetic storage layer
25 antiferromagnetic reference layer
3 selection transistor, front-end layer
31 spin polarized write current
4 top electrode, current line
5 bottom electrode
6 underlayer

The invention claimed is:

1. A magnetic random access memory (MRAM) cell suitable for performing a thermally assisted write operation or a spin torque transfer (STT) based write operation, comprising:
    a magnetic tunnel junction comprising a top electrode; a first ferromagnetic layer having a first magnetization direction; a second ferromagnetic layer having a second magnetization direction that can be adjusted with respect to the first magnetization direction;
    a tunnel barrier layer between the first ferromagnetic layer and the second ferromagnetic layer; a front-end layer, the second ferromagnetic layer being between the front-end layer and the tunnel barrier layer;
    the magnetic tunnel junction further comprising a magnetic or metallic layer, and an underlayer, on which the second ferromagnetic layer is deposited such that the second ferromagnetic layer has a roughness of less than about 0.2 nm RMS and a grain size of less than about 15nm, the underlayer having a crystallographic structure that matches a crystallographic structure of the second ferromagnetic layer; and
    the second ferromagnetic layer has a thickness comprised between about 0.5 nm and about 2 nm and the magnetic tunnel junction has a magnetoresistance larger than about 100%.

2. MRAM cell according to claim 1, wherein the second magnetization direction of the second ferromagnetic layer can be adjusted in a reversible manner by passing a spin polarized current in the magnetic tunnel junction.

3. MRAM cell according to claim 1, wherein the second ferromagnetic magnetic layer is made from an alloy comprising one of Fe, Ni, Co, Cr, V, Si and B, or a combination of any one of them.

4. MRAM cell according to claim 1, wherein said magnetic or metallic layer comprises an underlayer in contact with the second ferromagnetic layer.

5. MRAM cell according to claim 4, wherein the underlayer is made of a metallic polycrystalline alloy comprising one of Ta, Ti, Cu, Ru, NiFe, TiW, NiFeCr, CoSi, or comprising one of TaN, TiN, CuN, TiWN, CoSiN.

6. MRAM cell according to claim 4, wherein the underlayer has a thickness in the range comprised between about 1 nm and about 100 nm.

7. MRAM cell according to claim 1, wherein said magnetic or metallic layer comprises an antiferromagnetic storage layer.

8. MRAM cell according to claim 1, wherein said magnetic or metallic layer comprises a bottom electrode.

9. MRAM cell according to claim 1, wherein said second ferromagnetic layer is configured to provide the magnetic tunnel junction with the magnetoresistance that is larger than about 100% by having been annealed at a temperature between about 280° C. and about 360° C. for between about 30 minutes and 2 hours 30 minutes under an applied magnetic field of between about 0.5 Tesla and about 2 Tesla.

10. Method for forming the MRAM cell of claim 1, the method comprising:
    depositing the second ferromagnetic layer on the magnetic or metallic layer;
    depositing the tunnel barrier layer on the second ferromagnetic layer; and
    depositing the first ferromagnetic layer on the tunnel barrier layer;
    the second ferromagnetic layer being deposited with the thickness comprised between about 0.5 nm and about 2 nm.

11. Method according to claim 10, wherein the magnetic tunnel junction further comprises a bottom electrode, and wherein the method further includes depositing the bottom electrode, and depositing the second ferromagnetic layer on the bottom electrode.

12. Method according to claim 11, wherein the magnetic tunnel junction further comprises an antiferromagnetic storage layer, and wherein the method further comprises depositing the antiferromagnetic storage layer between the bottom electrode and the second ferromagnetic layer.

13. Method according to claim from 10, further comprising depositing the underlayer made of a metallic polycrystalline alloy, said depositing the second ferromagnetic layer comprises depositing the second ferromagnetic layer on the underlayer.

14. Method according to claim 13, wherein the underlayer is deposited with a thickness being comprises between about 1 nm and about 100 nm.

15. A magnetic memory device comprising a plurality of MRAM cells, each MRAM cell comprising a magnetic tunnel junction comprising a top electrode;

a tunnel barrier layer comprised between a first ferromagnetic layer having a first magnetization direction, and a second ferromagnetic layer having a second magnetization direction adjustable with respect to the first magnetization direction;

a front-end layer; and a magnetic or metallic layer, and an underlayer, on which the second ferromagnetic layer is deposited such that the second ferromagnetic layer has a roughness of less than about 0.2 nm RMS and a grain size of less than about 15 nm, the underlayer having a crystallographic structure that matches a crystallographic structure of the second ferromagnetic layer, and the second ferromagnetic layer being comprised between the front-end layer and the tunnel barrier layer and having a thickness comprised between about 0.5 nm and about 2 nm, such that magnetic tunnel junction has a magnetoresistance larger than about 100%.

* * * * *